United States Patent
Kohno

(10) Patent No.: US 6,521,504 B1
(45) Date of Patent: *Feb. 18, 2003

(54) SEMICONDUCTOR DEVICE AND METHOD OF FABRICATING THE SAME

(75) Inventor: Hiroshi Kohno, Tokyo (JP)

(73) Assignee: NEC Compound Semiconductor Devices, Ltd., Kanagawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/448,761

(22) Filed: Nov. 24, 1999

Related U.S. Application Data

(62) Division of application No. 08/734,084, filed on Oct. 21, 1996, now abandoned.

(30) Foreign Application Priority Data

Oct. 20, 1995 (JP) ............................................. 7-272161

(51) Int. Cl.[7] .......................................... H01L 21/331
(52) U.S. Cl. ....................................... 438/341; 438/481
(58) Field of Search ................................ 438/269, 341, 438/481

(56) References Cited

U.S. PATENT DOCUMENTS

| | | | |
|---|---|---|---|
| 4,458,158 A | * 7/1984 | Mayrand | 326/101 |
| 4,853,342 A | * 8/1989 | Taka et al. | 438/283 |
| 5,051,570 A | * 9/1991 | Tsujikawa et al. | 250/201.1 |
| 5,066,355 A | * 11/1991 | Miyao et al. | 117/8 |
| 5,134,454 A | 7/1992 | Neudeck et al. | |
| 5,219,767 A | 6/1993 | Kohno | |
| 5,476,811 A | * 12/1995 | Fujii et al. | 438/37 |
| 5,489,799 A | * 2/1996 | Zambrano et al. | 257/587 |
| 5,863,831 A | * 1/1999 | Ling et al. | |

FOREIGN PATENT DOCUMENTS

| JP | A4898775 | 12/1973 |
|---|---|---|
| JP | A52123870 | 10/1977 |
| JP | 59186367 | 10/1984 |
| JP | 5211158 | 8/1993 |

OTHER PUBLICATIONS

Wolf, S., Tauber R.N.; Silicon Processing for the VLSI Era vol. 1: Process Technology, Lattice Press, Sunset Beach, CA, 1986, pp. 124, 156 and 157.*

(List continued on next page.)

Primary Examiner—John F. Niebling
Assistant Examiner—Christopher Lattin
(74) Attorney, Agent, or Firm—Sughrue Mion, PLLC

(57) ABSTRACT

There is provided a method of fabricating a semiconductor device, including the steps of (a) forming a first conductivity type base region in a second conductivity type collector region by molecular beam epitaxy (MBE), (b) forming an emitter region in the base region by implanting second conductivity type impurities into the base region by MBE; (c) forming a second conductivity type amorphous layer on the emitter region by MBE, and (d) forming an emitter contact region by causing the second conductivity type amorphous layer to grow in solid phase. The method makes it possible to establish not only a base region but also an emitter region in ambient temperature growth by means of an MBE apparatus. Herein, the emitter region has a shallow depth and uniform impurities content by implanting antimony (Sb) into a region with a substrate being applied a voltage directly in an MBE apparatus. Thus, it is no longer necessary to carry out thermal treatment at high temperature after the formation of a base region, resulting in prevention of degradation of crystallinity and prevention of changes in impurities depth profile.

20 Claims, 7 Drawing Sheets

OTHER PUBLICATIONS

Gergam et al.;'Antimony delta doping by low energy implantation in molecular–beam epitaxy Si Layers', J. Vac. Sci. Technol. Part B, vol. 11, No. 5, pp. 1793–1797, Sep. 1993.*

European Search Report dated Mar. 24, 1999.

European Patent Office, Patent Abstracts of Japan, Publication No. 05211158, Publication Date: Aug. 20, 1993.

Boron Doping of Si–Ge Base Of Heterobipolar Transistors, H. Kibbel, E. Kasper and P. Narozny, 2194 Thin Solid Films, 184(1990)Jan., No. 1, Lausanne, CH.

An Overview Of Doping Strategies In Si:MBE, Richard Kubiak and Carl Parry, Department of Physics, University of Warwick, Coventry, CV47AL England, Mal. Res. Soc. Symp. Proc. vol. 220, 1991 Materials Research Study.

Antimony δ doping by low energy implantation in molecular–beam epitaxy Si layers, E. Gergam, H. Charki, M. Lazzouni, and A. Vapaille, Institut d'Electronique Fondamentale–URA 22–Universite de Paris Sud Batiment 220–91405 Orsay Cedex, France, 8257b Journal of Vacuum Science & Technology B 11 (1993) Sep./Oct., No. 5, Thorofare, NJ, US.

50 Ghz $Si_{1-x}Ge_x$ heterobipolar transistor: growth of the complete layer sequence by molecular beam epitaxy, E. Kasper, H. Kibbel and A. Gruhle, Daimler–Benz Research Center, Ulm (Germany), 2194 Thin Solid Films, 222(1992)Dec. 20, No. ½, Lausanne, CH.

$51^{st}$ Applied Physics Society Lecture Meeting, vol. 1, pp. 239, 27a–T–9.

* cited by examiner

US 6,521,504 B1

SEMICONDUCTOR DEVICE AND METHOD OF FABRICATING THE SAME

This is a divisional of application Ser. No. 08/734,084 filed Oct. 21, 1996, now abandoned, the disclosure of which is incorporated herein by reference.

BACKGROUND OF THE INVENTION

1. Field of the Invention

The invention relates to a semiconductor device and a method of fabricating the same, and more particularly to a semiconductor device having layers formed by means of molecular beam epitaxy and a method of fabricating a semiconductor device by using an apparatus for carrying out molecular beam epitaxy.

2. Description of the Related Art

Japanese Unexamined Patent Publication No. 5-211158 has suggested a method of fabricating a semiconductor device by means of molecular beam epitaxy (hereinafter, referred to simply as "MBE"). Hereinbelow is explained the method with reference to FIGS. 1A to 1D.

First, as illustrated in FIG. 1A, there is formed an N$^-$ epitaxial layer 2 over an N-type silicon substrate 1. The N$^-$ epitaxial layer 2 has a thickness ranging from 0.8 to 1.3 $\mu$m, and a resistivity ranging from 0.5 to 1.0 $\Omega$-cm. Then, the N$^-$ epitaxial layer 2 is thermally oxidized to thereby form a silicon dioxide film 3 having a thickness of about 100 nm. Then, a part of the silicon dioxide film 3 is removed by photolithography and anisotropic etching to thereby form a base region. Then, silicon and boron are evaporated in an apparatus for carrying out molecular beam epitaxy (hereinafter, referred to simply as "MBE apparatus") which provides about 10$^{-8}$ Torr vacuum to thereby form a P-type layer 4 on the N$^-$ epitaxial layer 2 at 650° C. of growth temperature. The P-type layer 4 has a thickness in the range of 30 to 50 nm, and a carrier concentration on the order of 10$^{18}$ cm$^{-3}$. Hereinbelow, an layer formed by means of the MBE apparatus, including the P-type layer 4, is referred to as "an MBE layer".

Then, silicon and boron are evaporated again in the MBE apparatus to thereby form a P$^-$ MBE layer 5 over the P-type MBE layer 4 at 650° C. of growth temperature. The P$^-$ MBE layer 5 has a thickness in the range of 5 to 20 nm. The P$^-$ MBE layer 5 functions as a buffer layer for maintaining both crystallinity at an interface between an emitter and a base and p-n junction in well condition. Thereafter, polysilicon having grown on the silicon dioxide film 3 are removed by means of photolithography and anisotropic etching such as CF$_4$ gas etching.

Then, as illustrated in FIG. 1B, a silicon dioxide film 6 and further a silicon nitride film 7 are formed on the P$^-$ MBE layer 5 and the silicon dioxide film 3 by chemical vapor deposition (CVD). The silicon dioxide film 6 and the silicon nitride film 7 both have a thickness of about 100 nm. Then, a photoresist 8 is deposited over the silicon nitride film 7, and patterned by photolithography, followed by anisotropic etching to thereby open an emitter region E.

Then, as illustrated in FIG. 1C, silicon and antimony are evaporated in the MBE apparatus to thereby deposit heavily doped amorphous silicon on the silicon substrate 1 at room temperature, followed by solid phase epitaxy at growth temperature of 730° C. to thereby form an N+ MBE layer 9 having a thickness in the range of 100 to 200 nm. Then, photolithography and subsequently anisotropic etching such as (CF$_4$+O$_2$) gas etching are carried out to the N+ MBE layer 9 to thereby form an emitter contact 9a.

The thus obtained emitter contact 9a composed of the N+ MBE layer 9 has been already sufficiently activated. Thus, it is no longer necessary to carry out thermal annealing at high temperature above growth temperature, resulting in that impurities depth profile is scarcely varied, and that it is possible to obtain desired characteristics by controlling thickness of base and emitter and/or carrier concentration.

Thereafter, the photoresist 8 is patterned by photolithography and anisotropically etched to thereby open a base contact B.

Then, as illustrated in FIG. 1D, a titanium (Ti)/platinum (Pt) layer 10 is deposited all over a resultant by vacuum evaporation. A gold layer 11 is deposited on the Ti/Pt layer 10, and then patterned by photolithography. The Ti/Pt layer 10 is anisotropically etched using the patterned gold layer 11 as a mask, to thereby form electrodes of base and emitter of a silicon bipolar transistor.

The above mentioned conventional method has an advantage that an emitter region almost free of crystal defects can be obtained without carrying out thermal annealing at high temperature for activation, because the thin base layer 4 is grown by MBE, and further the N+ MBE layer 9 is grown through solid phase epitaxy process by means of the MBE apparatus. To the contrary, the above mentioned conventional method has many shortcomings.

First, the emitter region is insufficiently shallow in depth, because the emitter region is established only through annealing in solid phase epitaxy.

Secondly, since a diffusion coefficient of boron in the base layer is greater than a diffusion coefficient of antimony in an emitter, a p-n junction interfacial plane between an emitter and a base is almost equal to an epi-poly interfacial plane established through the solid phase epitaxy. As a result, it is impossible to obtain sufficient crystallinity, which causes a base leakage current to be increased, thereby DC characteristic being deteriorated at a low current. As one of evidences for such deterioration, FIG. 2 shows Gummel plots for a transistor fabricated in accordance with the above mentioned conventional method. It is understood in view of the two curves Ic and I$_B$ in FIG. 2 that a base current IB is greater than a collector current Ic in the range where a current is small, resulting in that the forward current gain linearity is deteriorated.

Thirdly, a rapid thermal annealing (RTA) apparatus may be used in the conventional method to carry out implantation for forming a shallow emitter region. However, annealing is carried out in so short period of time that temperature in a wafer is not uniformized. As a result, there is generated dispersion in characteristics, which lowers a production yield.

Ion implantation and thermal diffusion, which have been widely used, have a shortcoming that they make the implantation depth so deep that crystal defects are increased, resulting in that it is necessary to carry out thermal annealing at high temperature for activation. In addition, those prior methods have another shortcoming that a silicon wafer has to be taken out of an MBE apparatus each time when ion implantation is to be carried out.

A report No. 27a-T-9 by the title of "B and Sb Heavy Doping for Si-MBE" in the 51st Applied Physical Society lecture meeting, Vol. 1, pp 239, Autumn 1990, has indicated a problem that it is impossible in conventional methods of fabricating a bipolar transistor to have steep impurities depth profile, because base and emitter are formed by ion implantation and thermal treatment at high temperature such as annealing. Recently, Si-MBE has been applied to formation of a thin base layer for establishing steep impurities depth profile at ambient temperature. However, technique for heavily doping B and Sb is not established yet. Thus, the results of the experiments are reported about activation rate, crystallinity, and dependency on azimuth of substrate planes during B and Sb are being heavily doped.

SUMMARY OF THE INVENTION

It is an object of the present invention to provide a semiconductor device and a method of fabricating the same which are capable of forming an emitter region which are shallow, but sufficiently uniform in impurities concentration with the result of no necessity of thermal annealing at high temperature after the formation of a base layer, prevention of degradation of crystallinity, and prevention of variation of impurities depth profile.

In one aspect, there is provided a method of fabricating a semiconductor device, including the steps of (a) forming a first molecular beam epitaxy layer on a semiconductor substrate, (b) implanting impurities into the first molecular beam epitaxy layer, and (c) forming a second molecular beam epitaxy layer on the first molecular beam epitaxy layer.

It is preferable that the second molecular beam epitaxy layer is formed only on a portion of the first molecular beam epitaxy layer into which the impurities have been implanted. The first molecular beam epitaxy layer may be designed to have an opposite conductivity to that of the semiconductor substrate, and the second molecular beam epitaxy layer may have the same conductivity as that of the semiconductor substrate.

There is further provided a method of fabricating a semiconductor device, including the steps of (a) forming a first conductivity type epitaxial layer on a second conductivity type semiconductor substrate, (b) implanting second conductivity type impurities into at least a part of the first conductivity type epitaxial layer, (c) forming a second conductivity type amorphous layer on the part into which the second conductivity type impurities have been implanted, and (d) causing the second conductivity type amorphous layer to grow in solid phase.

There is still further provided a method of fabricating a semiconductor device, including the steps of (a) forming a first conductivity type base region in a second conductivity type collector region by molecular beam epitaxy, (b) forming an emitter region in the base region by implanting second conductivity type impurities into the base region by molecular beam epitaxy, (c) forming a second conductivity type amorphous layer on the emitter region by molecular beam epitaxy, and (d) forming an emitter contact region by causing the second conductivity type amorphous layer to grow in solid phase.

The steps where molecular beam epitaxy is to be accomplished may be carried out in a common apparatus for accomplishing molecular beam epitaxy. The impurities are selected from antimony (Sb), phosphorus (P) and arsenic (As). Impurities implantation is accomplished by application of a voltage directly to the semiconductor substrate during doping.

There is yet further provided a method of fabricating a semiconductor device, including the steps of (a) forming a heavily doped first conductivity type layer buried in a second conductivity type semiconductor substrate, (b) forming a lightly doped first conductivity type epitaxial layer on the heavily doped first conductivity type layer so that the lightly doped first conductivity type epitaxial layer is exposed to a surface of the semiconductor substrate, (c) forming a heavily doped first conductivity type connection layer for connecting the heavily doped first conductivity type layer to a surface of the semiconductor substrate, (d) forming a first molecular beam epitaxy layer on the lightly doped first conductivity type epitaxial layer, the first molecular beam epitaxy layer being of a second conductivity type, (e) implanting first conductivity type impurities into the first molecular beam epitaxy layer to form an impurities implantation layer, and (f) forming a second molecular beam epitaxy layer on both the impurities implantation layer and the connection layer, the second molecular beam epitaxy layer being of a first conductivity type.

For instance, the first molecular beam epitaxy layer may be comprised of a first epitaxial layer and the second molecular beam epitaxy layer may be comprised of an amorphous layer. The method may further include the step of causing the second molecular beam epitaxy layer to grow in solid phase to a second epitaxial layer and a polysilicon layer.

There is further provided a method of fabricating a semiconductor device, including the steps of (a) forming a heavily doped first conductivity type layer buried in a second conductivity type semiconductor substrate, (b) forming a lightly doped first conductivity type epitaxial layer on the heavily doped first conductivity type layer so that the lightly doped first conductivity type epitaxial layer is exposed to a surface of the semiconductor substrate, (c) forming a heavily doped first conductivity type connection layer for connecting the heavily doped first conductivity type layer to a surface of the semiconductor substrate, (d) forming a second conductivity type epitaxial layer on the lightly doped first conductivity type epitaxial layer, (e) implanting first conductivity type impurities into at least a part of the second conductivity type epitaxial layer to form an impurities implantation layer, (f) forming a first conductivity type amorphous layer on both the impurities implantation layer and the connection layer, and (g) causing the first conductivity type amorphous layer to grow in solid phase.

There is further provided a method of fabricating a semiconductor device, including the steps of (a) forming a heavily doped first conductivity type layer buried in a second conductivity type semiconductor substrate, (b) forming a lightly doped first conductivity type epitaxial layer on the heavily doped first conductivity type layer so that the lightly doped first conductivity type epitaxial layer is exposed to a surface of the semiconductor substrate, (c) forming a heavily doped first conductivity type connection layer for connecting the heavily doped first conductivity type layer to a surface of the semiconductor substrate, (d) forming a second conductivity type base region in a first conductivity type collector region on the lightly doped first conductivity type epitaxial layer by molecular beam epitaxy, (e) forming an emitter region in the base region by implanting first conductivity type impurities into the base region by molecular beam epitaxy, (f) forming a first conductivity type amorphous layer on both the emitter region and the connection layer by molecular beam epitaxy, and (g) forming an emitter contact region by causing the first conductivity type amorphous layer to grow in solid phase.

In another aspect, there is provided a semiconductor device including (a) a first conductivity type semiconductor substrate, (b) a first molecular beam epitaxy layer formed on the semiconductor substrate, the first molecular beam epitaxy layer being of a second conductivity type, (c) an impurities implantation layer into which first conductivity type impurities are implanted, formed at a surface of the first molecular beam epitaxy layer, and (d) a second molecular beam epitaxy layer formed on the impurities implantation layer, the second molecular beam epitaxy layer being of a first conductivity type.

The first molecular beam epitaxy layer may be comprised of an epitaxial layer, and the second molecular beam epitaxy layer may be comprised of an amorphous layer. For instance, the impurities are selected from antimony (Sb), phosphorus (Pb) and arsenic (As).

There is further provided a semiconductor device including (a) a first conductivity type semiconductor substrate, (b) a second conductivity type epitaxial layer formed on the semiconductor substrate, (c) an impurities implantation layer comprised of a part of the second conductivity type epitaxial layer into which first conductivity type impurities are implanted, and (d) a first conductivity type amorphous layer formed on the impurities implantation layer.

There is still further provided a semiconductor device including (a) a first conductivity type semiconductor substrate, (b) a second conductivity type base region formed in a first conductivity type collector region of the semiconductor substrate, (c) an emitter region formed in the base region, first conductivity type impurities being implanted in the emitter region, and (d) a first conductivity type amorphous layer formed on the emitter region.

There is yet further provided a semiconductor device including (a) a first conductivity type semiconductor substrate, (b) a heavily doped second conductivity type layer buried in the semiconductor substrate, (c) a lightly doped second conductivity type epitaxial layer formed on the heavily doped second conductivity type layer so that the lightly doped second conductivity type epitaxial layer is exposed to a surface of the semiconductor substrate, (d) a heavily doped second conductivity type connection layer for connecting the heavily doped second conductivity type layer to a surface of the semiconductor substrate, (e) a first molecular beam epitaxy layer formed on the lightly doped second conductivity type epitaxial layer, the first molecular beam epitaxy layer being of a first conductivity type, (f) an impurities implantation layer formed partially at a surface of the first molecular beam epitaxy layer, second conductivity type impurities being implanted into the impurities implantation layer, and (g) a second molecular beam epitaxy layer formed on both the impurities implantation layer and the connection layer, the second molecular beam epitaxy layer being of a second conductivity type.

There is further provided a semiconductor device including (a) a first conductivity type semiconductor substrate, (b) a heavily doped second conductivity type layer buried in the semiconductor substrate, (c) a lightly doped second conductivity type epitaxial layer formed on the heavily doped second conductivity type layer so that the lightly doped second conductivity type epitaxial layer is exposed to a surface of the semiconductor substrate, (d) a heavily doped second conductivity type connection layer for connecting the heavily doped second conductivity type layer to a surface of the semiconductor substrate, (e) a first conductivity type epitaxial layer formed on the lightly doped second conductivity type epitaxial layer, (f) an impurities implantation layer formed partially at a surface of the first molecular beam epitaxy layer, second conductivity type impurities being implanted into the impurities implantation layer, and (g) a second conductivity type amorphous layer formed on both the impurities implantation layer and the connection layer.

There is further provided a semiconductor device including (a) a first conductivity type semiconductor substrate, (b) a heavily doped second conductivity type layer buried in the semiconductor substrate, (c) a lightly doped second conductivity type epitaxial layer formed on the heavily doped second conductivity type layer so that the lightly doped second conductivity type epitaxial layer is exposed to a surface of the semiconductor substrate, (d) a heavily doped second conductivity type connection layer for connecting the heavily doped second conductivity type layer to a surface of the semiconductor substrate, (e) a first conductivity type base region formed in a second conductivity type collector region on the lightly doped second conductivity type epitaxial layer, (f) an emitter region formed in the base region, second conductivity type impurities being implanted into the emitter region, and (g) a second conductivity type amorphous layer formed on both the emitter region and the connection layer.

In accordance with the above mentioned present invention, it is possible to establish not only a base region but also an emitter region in ambient temperature growth by means of an MBE apparatus. Herein, the emitter region can have a shallow depth and a uniform, sufficient impurities content by implanting impurities such as antimony (Sb) into a region with a substrate being DC-biased in an MBE apparatus. Thus, it is no longer necessary to carry out thermal treatment at high temperature after the formation of a base region, resulting in prevention of degradation of crystallinity and prevention of changes in impurities depth profile. In addition, since a p-n junction interfacial plane is formed in a base epitaxial layer, it is possible to obtain better crystallinity with the result of improvement in DC characteristic.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 3:
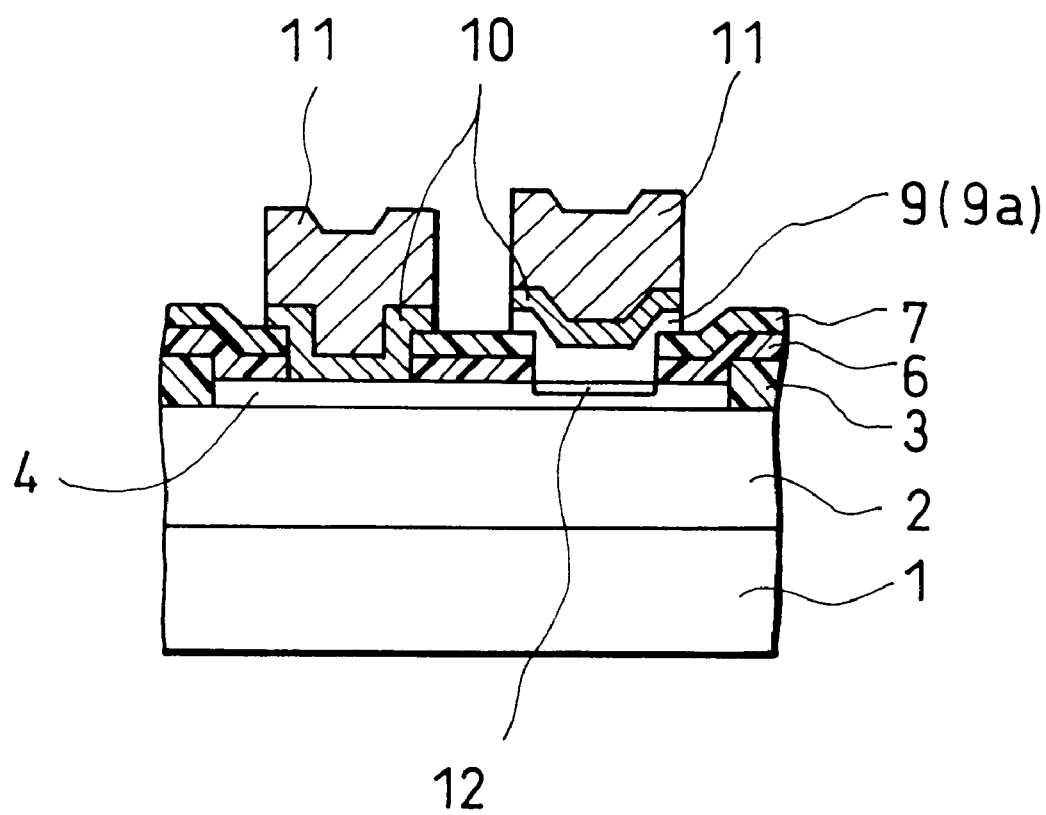
FIG. 3 is a cross-sectional view of a silicon bipolar transistor fabricated in accordance with the first embodiment of the present invention.

FIG. 3 is a cross-sectional view of a silicon bipolar transistor fabricated in accordance with the first embodiment of the present invention. The illustrated silicon bipolar transistor includes a N-type silicon substrate 1 in which an N⁻ epitaxial layer 2 is formed. On the N⁻ epitaxial layer 2 are formed silicon dioxide films 3 between which a device formation region is formed. On the N⁻ epitaxial layer 2 and between the silicon dioxide films 3 is deposited a P-type MBE layer formed by means of molecular beam epitaxy. Impurities such as antimony (Sb) are implanted into a part of the P-type MBE layer 4 to thereby form an impurities implantation layer 12 at a surface of the P-type MBE layer 4.

On the N⁻ epitaxial layer 2 and the silicon dioxide films 3 are deposited a silicon dioxide film 6 and a silicon nitride film 7. The silicon dioxide film 6 and silicon nitride film 7 are etched out to thereby form two openings, one of which forms an emitter region in alignment with the impurities implantation layer 12, and the other forms a base region.

In the emitter region, an N+ MBE layer 9 is deposited on the impurities implantation layer 12 by molecular beam epitaxy to thereby form an emitter contact 9a. On the emitter contact 9a are formed a patterned titanium (Ti)/platinum (Pt) layer 10 and a patterned gold layer 11. In the base region, on the P-type MBE layer 4 are formed the patterned Ti/Pt layer 10 and gold layer 11.

A method of fabricating the silicon bipolar transistor illustrated in FIG. 3 is explained hereinbelow with reference to FIGS. 4A to 4G.

Figure 4A:
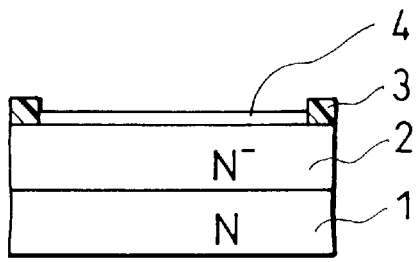
FIGS. 4A to 4G are cross-sectional views of a silicon bipolar transistor fabricated in accordance with the first embodiment of the present invention, each illustrating respective step of a method of fabricating the same.

First, as illustrated in FIG. 4A, there is formed an N⁻ epitaxial layer 2 in an N-type silicon substrate 1. The N⁻ epitaxial layer 2 has a thickness ranging from 0.8 to 1.3 $\mu$m, and a resistivity ranging from 0.5 to 1.0 $\Omega$-cm. Then, the N⁻ epitaxial layer 2 is thermally oxidized to thereby form a silicon dioxide film 3 having a thickness of about 100 nm. Then, a part of the silicon dioxide film 3 is removed by photolithography and anisotropic etching to thereby form a base region. Then, silicon and boron are evaporated in an MBE apparatus which provides about $10^{-8}$ Torr vacuum, to thereby form a P-type layer 4 on the N⁻ epitaxial layer 2 at 650° C. of growth temperature. The P-type layer 4 has a thickness in the range of 30 to 50 nm, and a carrier concentration on the order of $10^{18}$ cm$^{-3}$. There may be formed a P⁻ MBE layer on the P-type layer 4 by evaporating silicon and boron in the MBE apparatus and growing the layer at 650° C. of growth temperature. The P⁻ MBE layer may have a thickness in the range of 5 to 20 nm. The growth temperature is determined in dependence on plane azimuth of a substrate. In general, the growth is continued for a couple of minutes at temperature in the range of 620° C. to 700° C.

Thereafter, polysilicon having grown on the silicon dioxide films 3 are removed by means of photolithography and anisotropic etching such as CF$_4$ gas etching.

Figure 4B:
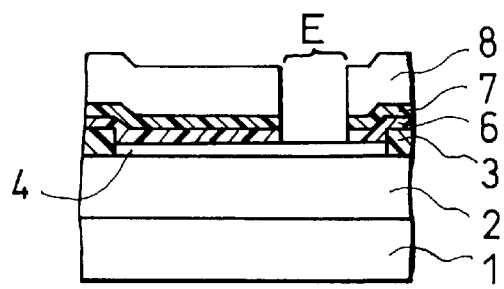

Then, as illustrated in FIG. 4B, a silicon dioxide film 6 and further a silicon nitride film 7 are formed on the P-type MBE layer 5 and the silicon dioxide films 3 by chemical vapor deposition (CVD). The silicon dioxide film 6 and the silicon nitride film 7 both have a thickness of about 100 nm. Then, a photoresist 8 is deposited over the silicon nitride film 7, and patterned by photolithography, followed by anisotropic etching to thereby open an emitter region E.

Figure 4C:
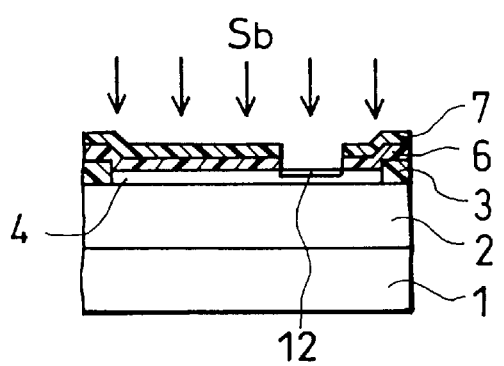

After removal of the photoresist 8, antimony (Sb) ions are implanted to a resultant from knudsen cells equipped with the MBE apparatus, as illustrated in FIG. 4C. During Sb ions implantation, a voltage is applied to the silicon substrate 1 in the range of –1 to –3 kV in the MBE apparatus. The DC bias facilitates ionized Sb atoms to be implanted into the P-type MBE layer 4, resulting in that a shallow N+ Sb implantation layer 12 is formed in the P-type MBE layer 4. The Sb atoms are implanted into the P-type MBE layer 4 at a dose of 1×10¹ to 10²⁰ atoms/cm³ at a depth in the range of 5 to 20 nm.

As an alternative to Sb atoms, phosphorus (P) or arsenic (As) atoms may be implanted into the P-type MBE layer 4. However, phosphorus is likely to burn in atmosphere, and arsenic is like to contaminate the MBE apparatus. In addition, atoms having a heavy atomic weight such as P and As have a shortcoming that they are likely to be implanted too deep. Since antimony atoms have a small atomic weight, it is possible to control them so that they are implanted into the P-type MBE layer 4 at a shallow depth. Thus, it is most preferable to use antimony as impurities. An implantation depth of antimony atoms is about tens of nanometers at greatest, which cannot be accomplished by usual ion implantation.

As used herein, the term "MBE apparatus" indicates an apparatus for forming a thin film by epitaxial growth, in particular, gas phase epitaxy, in further particular, physical deposition. In the MBE apparatus, composition elements are transformed into molecular beam in the form of beam under ultra-high vacuum, and then the beam is irradiated to a substrate to thereby carry out epitaxy. The growth rate is so small that it is relatively easy to form a thin film. It is also possible to form an epitaxial layer having good crystallinity by thermal treatment at low temperature.

A lot of ionized atoms exist in the molecular beam in the MBE apparatus. These ionized atoms are implanted into the silicon substrate at a shallow depth by directly DC-biasing the silicon substrate in the MBE apparatus. This process gives little damage to the substrate, and makes it possible to activate those ionized atoms with thermal treatment even at low temperature.

Figure 4D:
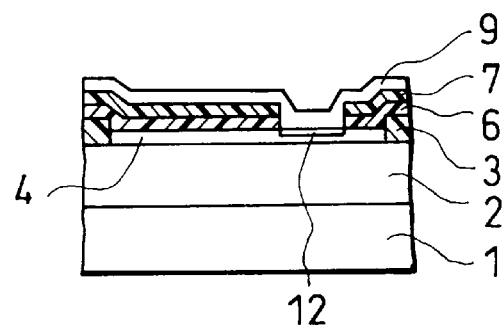

Then, as illustrated in FIG. 4D, heavily doped amorphous silicon is deposited on the silicon nitride film 7 and the Sb implantation layer 12 at room temperature by evaporating silicon and antimony in the MBE apparatus, followed by carrying out solid phase epitaxy process at growth temperature of 730° C. to thereby form an N+ MBE layer 9 having a thickness in the range of 100 to 200 nm. The Sb implantation layer 12 is activated simultaneously with the formation of the N+ MBE layer 9 to thereby establish an emitter region E.

The conditions for growth of the N+ MBE layer 9 are follows.

Growth temperature: 720° C. to 750° C.

Annealing time: 3 to 5 minutes

A layer formed by solid phase epitaxy process can have less crystal defects than a layer formed by other processes. Since there are much generated crystal defects in a layer formed by widely used usual ion implantation process, it is necessary to thermally treat the layer at high temperature for activation in the usual ion implantation. On the other hand, the ion implantation to be carried out with a silicon substrate being DC-biased in the MBE apparatus needs less energy for implantation than the usual ion implantation. Thus, the silicon substrate is less damaged, and hence can be sufficiently activated even at low temperature, resulting in that it is no longer necessary in the embodiment to thermally treat the substrate at high temperature. In addition, since it is possible to carry out a series of fabrication steps in an MBE apparatus, time and cost for fabrication can be significantly saved.

Figure 4E:
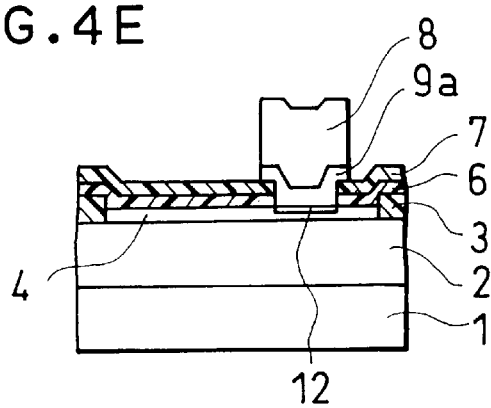

Thereafter, as illustrated in FIG. 4E, a photoresist 8 is deposited over the N+ MBE layer 9 and patterned by photolithography, and then etched by anisotropic etching such as ($CF_4+O_2$) gas etching to thereby form an emitter contact 9a. The thus formed emitter contact 9a made of the N+ MBE layer 9 has been already sufficiently activated.

Figure 4F:
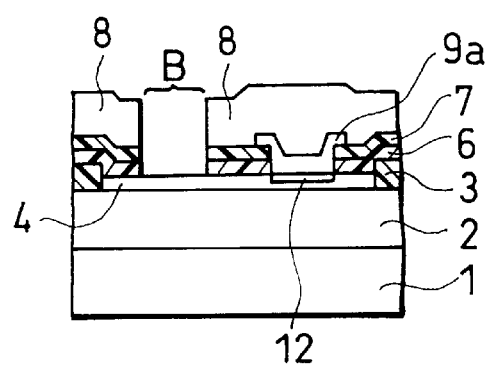

Then, after removal of the photoresist 8 deposited on the emitter contact 9a, a photoresist 8 is deposited again over a resultant, and patterned by photolithography. Then, as illustrated in FIG. 4F, the photoresist 8 is anisotropically etched to thereby open a base contact B.

Figure 4G:
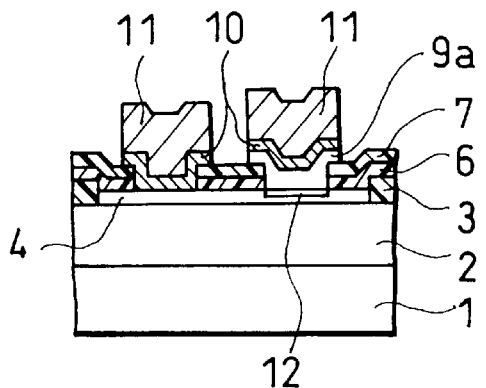

Then, after removal of the photoresist 8, as illustrated in FIG. 4G, a titanium (Ti)/platinum (Pt) layer 10 is deposited all over a resultant by vacuum evaporation. A gold layer 11 is deposited on the Ti/Pt layer 10, and then patterned by lithography. The Ti/Pt layer 10 is anisotropically etched using the patterned gold layer 11 as a mask, to thereby form electrodes of base and emitter of the silicon bipolar transistor.

In the above mentioned embodiment, not only a base but also an emitter are grown in an MBE apparatus, and impurities such as antimony (Sb) are implanted into a substrate at a shallow depth with the substrate being DC-biased in the MBE apparatus. Thus, unlike the conventional methods, a p-n junction interfacial plane is formed in a base epitaxial layer, and hence, it is possible to form an emitter region having a shallow depth and sufficient impurities concentration with the result of prevention of deterioration of DC characteristic. This is because epitaxial phase and polysilicon phase are not uniform in the vicinity of an interface between them in an emitter region due to solid phase diffusion, but a uniform p-n junction interface can be formed in a base epitaxial layer.

Figure 1A:
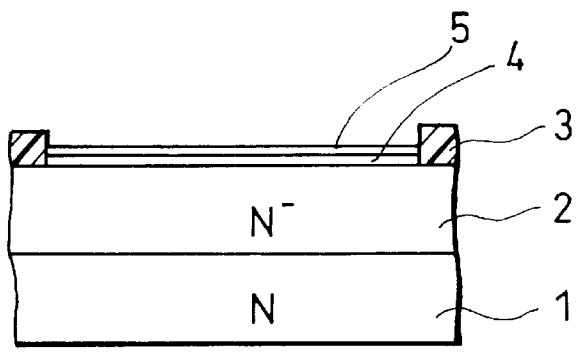
FIGS. 1A to 1D are cross-sectional views of a silicon bipolar transistor, each illustrating respective step of a conventional method of fabricating a silicon bipolar transistor.
Figure 1B:
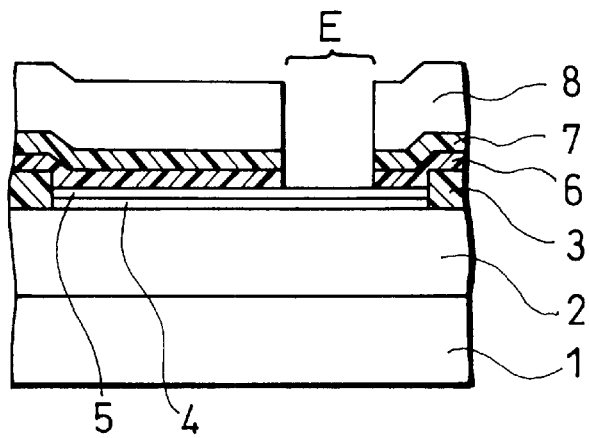
Figure 1C:
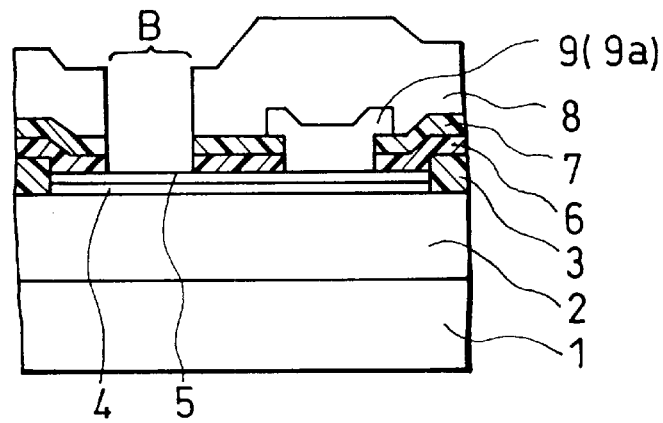
Figure 1D:
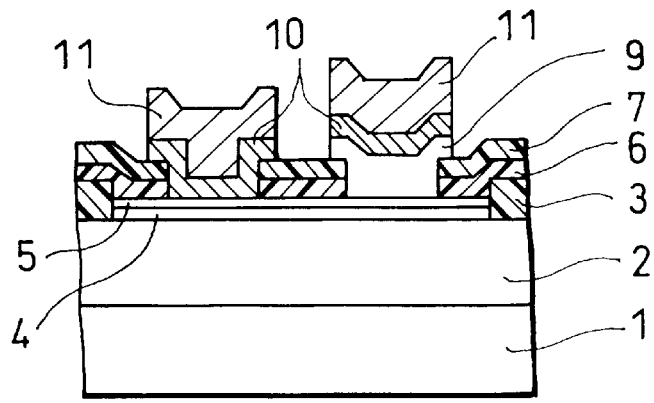
Figure 2:
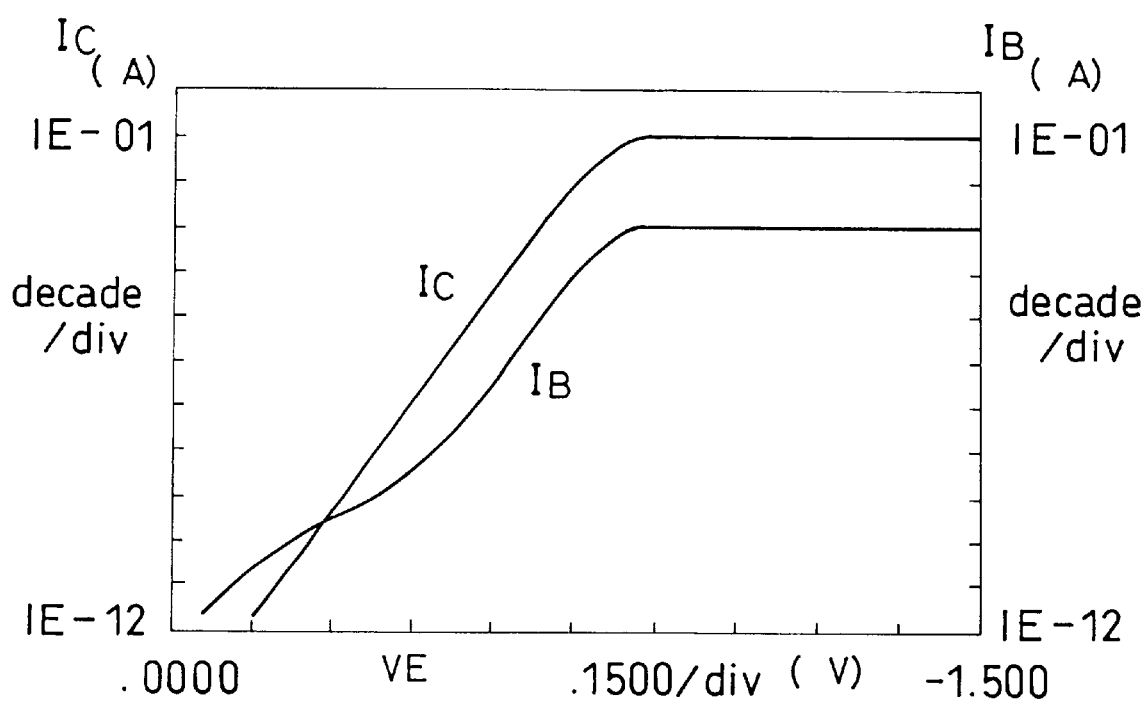
FIG. 2 shows Gummel plots for a conventional silicon bipolar transistor.
Figure 5:
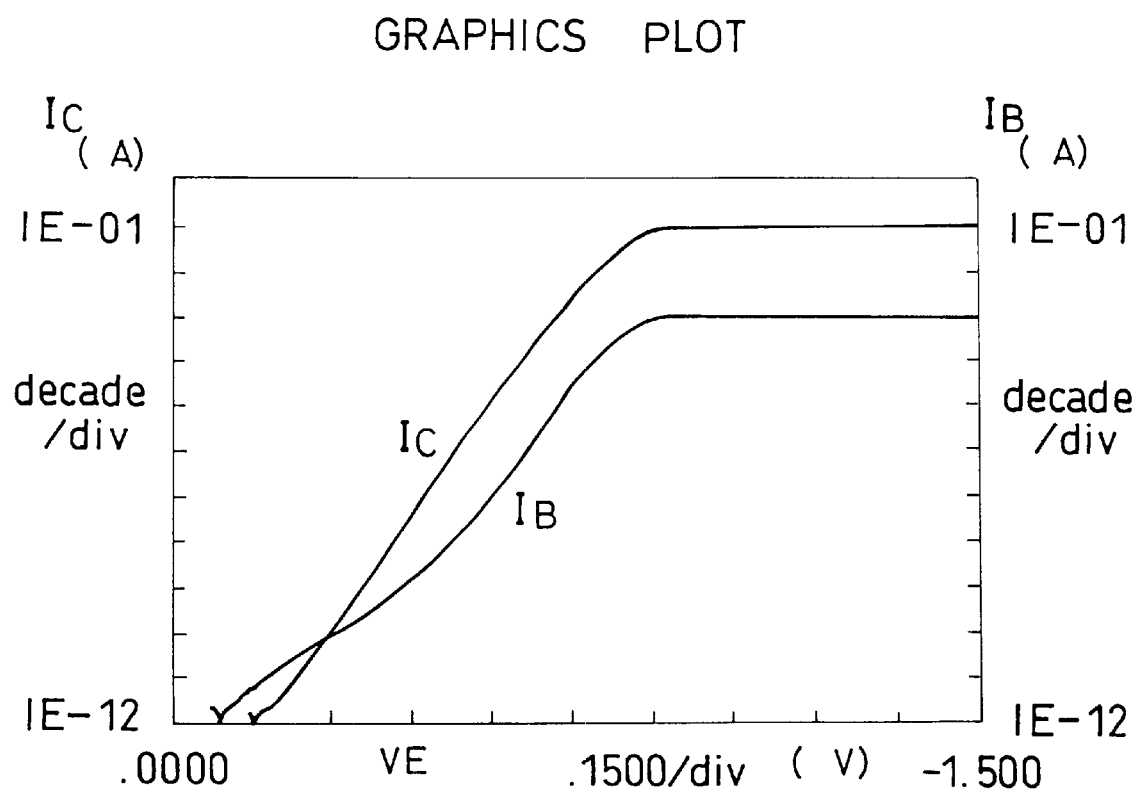
FIG. 5 shows Gummel plots for a silicon bipolar transistor fabricated in accordance with the first embodiment of the present invention.

FIG. 5 shows Gummel plots for a transistor fabricated in accordance with the above mentioned embodiment. It is understood in view of FIG. 5 that a base current $I_B$ is smaller than conventional one shown in FIG. 2 at a low current region (axis of ordinate). As a result, it is understood that the forward current gain linearity is improved.

In the above embodiment, if germanium (Ge) is evaporated from another knudsen cell in the MBE apparatus at an appropriate growth rate together with silicon and boron when the P+ MBE layer 4 is to be formed, it makes a SiGe heterojunction-bipolar transistor.

Figure 6:
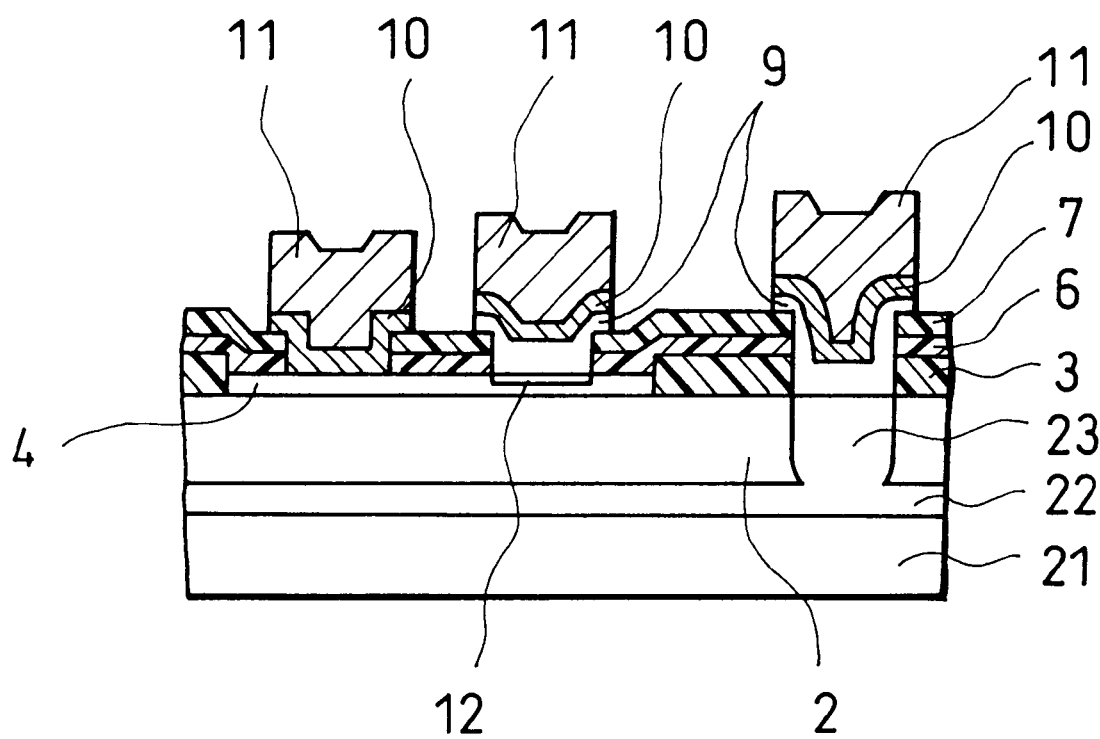
FIG. 6 is a cross-sectional view of a silicon bipolar transistor fabricated in accordance with the second embodiment of the present invention.

Hereinbelow is described the second embodiment of the present invention with reference to FIG. 6. FIG. 6 illustrates an integrated circuit including a silicon bipolar transistor fabricated in accordance with the second embodiment of the present invention.

The illustrated silicon bipolar transistor includes a P-type silicon substrate 21 in which there is formed an N+ buried layer 22. The N+ buried layer 22 is formed by implanting impurities such as arsenic (As) and antimony (Sb) into the P-type silicon substrate 21. On the N+ buried layer 22 is formed an N⁻ epitaxial layer 2 having a thickness ranging from 0.8 to 1.3 μm and resistivity ranging from 0.5 to 1.0 Ω·cm. There is further formed a N+ connection layer 23 vertically extending throughout the N⁻ epitaxial layer 2 for connecting the N+ buried layer 22 to an N+ MBE layer 9 formed on a surface of the P-type silicon substrate 1.

As illustrated in FIG. 6 at the left half, on the N⁻ epitaxial layer 2 are formed base and emitter electrodes which are the same as those of the first embodiment described with reference to in FIGS. 3 and 4A to 4G. On the N+ connection layer 23 is formed a collector electrode having the same structure as that of the emitter electrode. Namely, the collector electrode includes the N+ MBE layer 9 formed directly on the N+ connection layer 23, the Ti/Pt layer 10 formed on the N+ MBE layer 9, and the gold layer 11 formed on the Ti/Pt layer 10.

Hereinbelow is explained, with reference to FIGS. 7A to 7D, a method of fabricating the silicon bipolar transistor illustrated in FIG. 6.

Figure 7A:
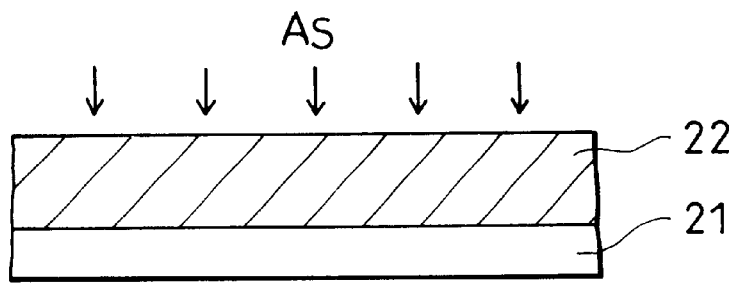
FIGS. 7A to 7D are cross-sectional views of a silicon bipolar transistor fabricated in accordance with the second embodiment of the present invention, each illustrating respective step of a method of fabricating the same.

First, a photoresist (not illustrated) is deposited all over the P-type silicon substrate 21, and then patterned by photolithography and anisotropic etching so that the photoresist does not exist on a region where the N+ buried layer 22 is to be formed. Then, as illustrated in FIG. 7A, impurities such as arsenic (As) are implanted into the P-type silicon substrate 21 to thereby form the N+ buried layer 22.

Figure 7B:
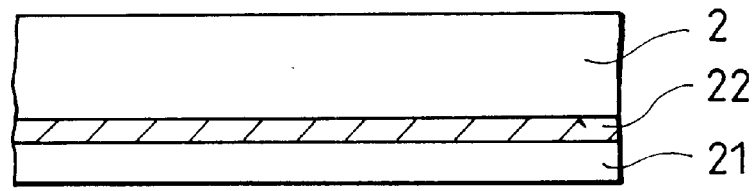

Then, as illustrated in FIG. 7B, the N⁻ epitaxial layer 2 is epitaxially grown on the N+ buried layer 22 by chemical vapor deposition.

Figure 7C:
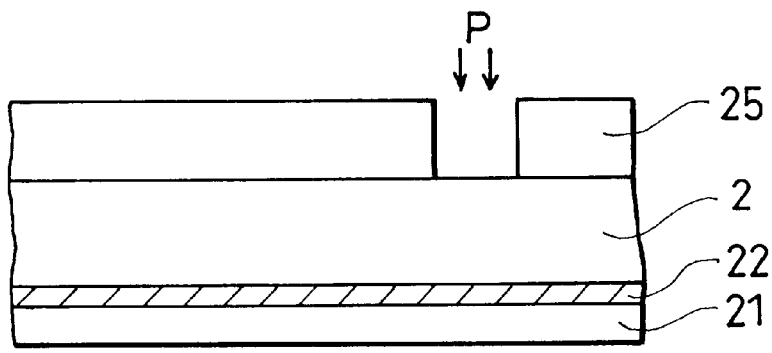

Then, as illustrated in FIG. 7C, a photoresist 25 is deposited over the silicon substrate 21 and patterned so that a collector region is open. Thereafter, impurities such as phosphorus (P) is implanted into the silicon substrate 21.

Figure 7D:
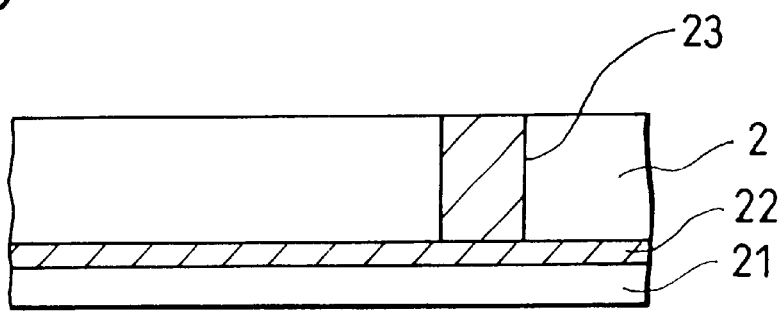

Thus, as illustrated in FIG. 7D, the N+ connection layer 23 is formed extending through the N⁻ epitaxial layer 2 for connecting the N+ buried layer 22 to a later formed collector electrode.

Then, the base and emitter electrodes are formed in the same manner as the first embodiment described with reference to FIGS. 4A to 4G. A collector electrode is also formed on the N+ connection layer 23 in the same manner as the emitter electrode. Thus, there is obtained a silicon bipolar transistor as illustrated in FIG. 6.

By using the P-type silicon substrate 21, the N+ buried layer 22, and the N⁻ epitaxial layer 2 as illustrated in FIG. 6, it is possible to fabricate an integrated circuit which is capable of forming a collector contact on an upper surface of the silicon substrate with the base and emitter electrode remaining as they are in the first embodiment illustrated in FIG. 3. It should be noted that LOCOS or trench structure is necessary to be taken in the second embodiment for device isolation. In addition, if a collector contact is made open simultaneously when an emitter contact is made open, it is possible to establish a collector contact, as well as an emitter contact, from heavily doped amorphous silicon into which antimony is implanted in the MBE apparatus, by means of solid phase epitaxy process at growth temperature of 730° C.

In accordance with the second embodiment, it is possible to form base, emitter and collector contacts directly on an upper surface of a substrate, and thus the silicon bipolar transistor fabricated in accordance with the present invention is applicable to various integrated circuits such as Bi-CMOS.

Similarly to the first embodiment, it is possible also in the second embodiment to fabricate an integrated circuit including a SiGe heterojunction-bipolar transistor by evaporating germanium at an appropriate growth rate together with silicon and boron when the P+ MBE layer 4 is formed in the MBE apparatus.

The application of the present invention is not to be limited to a bipolar transistor. The present invention can be applied to a thyrister and other semiconductor devices. It is possible to use a semiconductor substrate other than a silicon substrate. In addition, P- and N-type conductivity may be replaced with each other in the above mentioned two embodiments.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating a semiconductor device, comprising the steps of:
   (a) forming a base layer by molecular beam epitaxy (MBE) on a semiconductor substrate acting as a collector layer;
   (b) implanting impurities into said base layer to form an emitter region, said impurities having an electrical conductivity opposite to that of said base layer; and
   (c) forming an emitter layer on said base layer by molecular beam epitaxy (MBE).

2. The method as set forth in claim 1, wherein said emitter layer is formed only on a portion of said base layer into which said impurities have been implanted.

3. The method as set forth in claim 1, wherein said steps (a) and (b) are carried out in a common apparatus for accomplishing molecular beam epitaxy.

4. The method as set forth in claim 1, wherein said base layer is comprised of a first epitaxial layer and said emitter layer is comprised of an amorphous layer, and said method further comprising the step of causing said emitter layer to grow in solid phase to a second epitaxial layer and a polysilicon layer.

5. The method as set forth in claim 1, wherein said impurities are one of antimony (Sb), phosphorus (Pb) and arsenic (As).

6. The method as set forth in claim 1, wherein said semiconductor substrate s DC-biased during said step (b).

7. The method as set forth in claim 1, wherein said base layer has an opposite conductivity to that of said semiconductor substrate, and said emitter layer has the same conductivity as that of said semiconductor substrate.

8. A method of fabricating a semiconductor device, comprising the steps of:
   (a) forming a base layer by molecular beam epitaxy (MBE) on a semiconductor substrate acting as a collector layer, said base layer having a first conductivity type and said semiconductor substrate having a second conductivity type;
   (b) implanting second conductivity type impurities into at least a part of said base layer to form an emitter region;
   (c) forming a second conductivity type amorphous layer as an emitter layer on said part into which said second conductivity type impurities have been implanted; and
   (d) causing said second conductivity type amorphous layer to grow in solid phase.

9. The method as set forth in claim 8, wherein said steps (a) and (b) are carried out in a common apparatus for accomplishing molecular beam epitaxy.

10. The method as set forth in claim 8, wherein said impurities are one of antimony (Sb), phosphorus (Pb) and arsenic (As).

11. The method as set forth in claim 8, wherein said semiconductor substrate is DC-biased during said step (b).

12. A method of fabricating a semiconductor device, comprising the steps of:
   (a) forming a first conductivity type base region in a second conductivity type collector region by molecular beam epitaxy;
   (b) forming an emitter region in said base region by implanting second conductivity type impurities into said base region by molecular beam epitaxy;
   (c) forming a second conductivity type amorphous layer on said emitter region by molecular beam epitaxy; and
   (d) forming an emitter contact region by causing said second conductivity type amorphous layer to grow in solid phase.

13. The method as set forth in claim 12, wherein said steps (a), (b) and (c) are carried out in a common apparatus for accomplishing molecular beam epitaxy.

14. The method as set forth in claim 12, wherein said base region is composed of epitaxial silicon, and said impurities are one of antimony (Sb), phosphorus (P) and arsenic (As).

15. The method as set forth in claim 12, wherein said base region is DC-biased during said step (b).

16. A method of fabricating a semiconductor device, comprising the steps of:
   (a) forming a heavily doped first conductivity type layer buried in a second conductivity type semiconductor substrate;
   (b) forming a lightly doped first conductivity type epitaxial layer as a base layer on said heavily doped first conductivity type layer so that said lightly doped first conductivity type epitaxial layer is exposed to a surface of said semiconductor substrate;
   (c) forming a heavily doped first conductivity type connection layer for connecting said heavily doped first conductivity type layer to a surface of said semiconductor substrate;
   (d) forming a second conductivity type base region in a first conductivity type collector region on said lightly doped first conductivity type epitaxial layer by molecular beam epitaxy;
   (e) forming an emitter region in said base region by implanting first conductivity type impurities into said base region by molecular beam epitaxy;
   (f) forming a first conductivity type amorphous layer on both said emitter region and said connection layer by molecular beam epitaxy; and
   (g) forming an emitter contact region by causing said first conductivity type amorphous layer to grow in solid phase.

17. The method as set forth in claims 16, wherein said steps (d), (e) and (f) are carried out in a common apparatus for accomplishing molecular beam epitaxy.

18. The method as set forth in claim 16, wherein said base region is composed of epitaxial silicon, and said impurities are one of antimony (Sb), phosphorous (P) and arsenic (As).

19. The method as set forth in claim 16, wherein said base region is DC-biased during said step (e).

20. The method as set forth in claim 6, wherein said impurities are irradiated from Knudsen cells equipped with a molecular beam epitaxy apparatus.

* * * * *

UNITED STATES PATENT AND TRADEMARK OFFICE
CERTIFICATE OF CORRECTION

PATENT NO.     : 6,521,504 B1
DATED          : February 18, 2003
INVENTOR(S)    : Hiroshi Kohno It is certified that error appears in the above-identified patent and that said Letters Patent is hereby corrected as shown below:

<u>Column 8,</u>
Line 4, delete "$1 \times 10$ to $10^{20}$" insert -- $1 \times 10^{19}$ to $10^{20}$ --

Signed and Sealed this

First Day of July, 2003

JAMES E. ROGAN
*Director of the United States Patent and Trademark Office*